(12) United States Patent
Grande et al.

(10) Patent No.: US 7,736,592 B2
(45) Date of Patent: Jun. 15, 2010

(54) MICROFLUIDIC DEVICES FABRICATED BY DIRECT THICK FILM WRITING AND METHODS THEREOF

(75) Inventors: William J. Grande, Pittsford, NY (US); Gary A. Fino, West Henrietta, NY (US)

(73) Assignee: Ohmcraft, Inc., Honeoye Falls, NY (US)

( * ) Notice: Subject to any disclaimer, the term of this patent is extended or adjusted under 35 U.S.C. 154(b) by 1097 days.

(21) Appl. No.: 11/328,697

(22) Filed: Jan. 10, 2006

(65) Prior Publication Data

US 2006/0201812 A1 Sep. 14, 2006

Related U.S. Application Data

(60) Provisional application No. 60/642,654, filed on Jan. 10, 2005.

(51) Int. Cl.
*B01L 3/02* (2006.01)
(52) U.S. Cl. .................................................. 422/100
(58) Field of Classification Search .................. 422/100
See application file for complete search history.

(56) References Cited

U.S. PATENT DOCUMENTS

| 6,509,085 B1 | 1/2003 | Kennedy |
| 7,112,463 B2 * | 9/2006 | Horning et al. .............. 438/52 |
| 2002/0160561 A1 | 10/2002 | Ouellet |

* cited by examiner

*Primary Examiner*—Walter D Griffin
*Assistant Examiner*—Bobby Ramdhanie
(74) *Attorney, Agent, or Firm*—Nixon Peabody LLP

(57) ABSTRACT

The present invention relates to a process for producing a microfluidic device which involves providing a substrate with a surface and writing a first flowable material on the surface of the substrate. The first flowable material is then solidified to form spacer elements, each with a top surface distal from the surface of the substrate, and a second flowable material is written on the surface of the substrate. A cover having a surface is provided and applied to the substrate, with the surface of the cover contacting the top surfaces of the spacer elements. The second flowable material is solidified to form walls, where the walls, the surface of the substrate, and the surface of the cover form flow channels of a microfluidic device. The resulting microfluidic device is also disclosed.

13 Claims, 7 Drawing Sheets

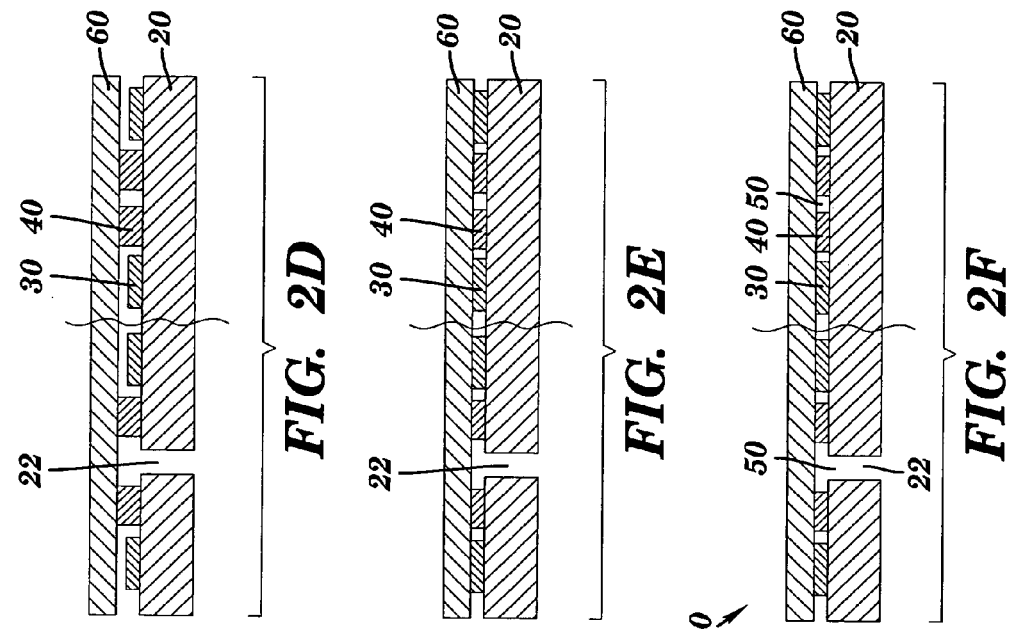
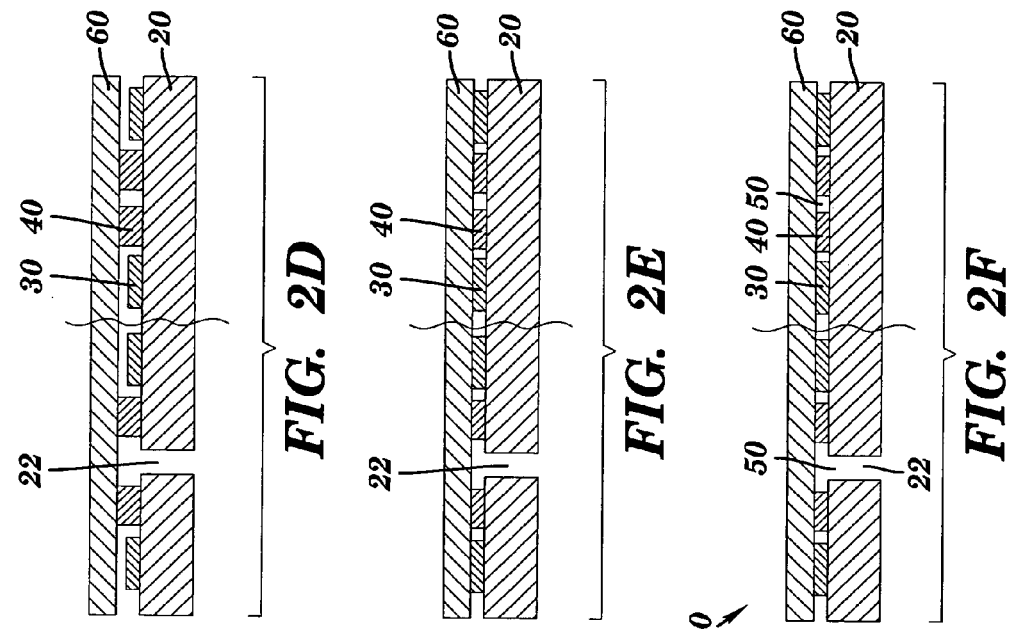
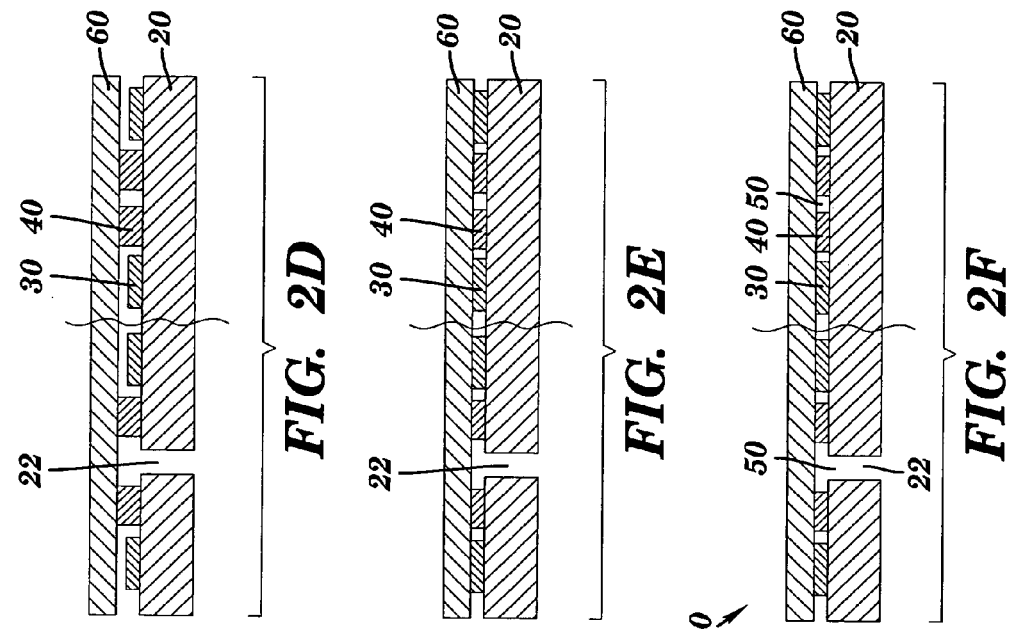

  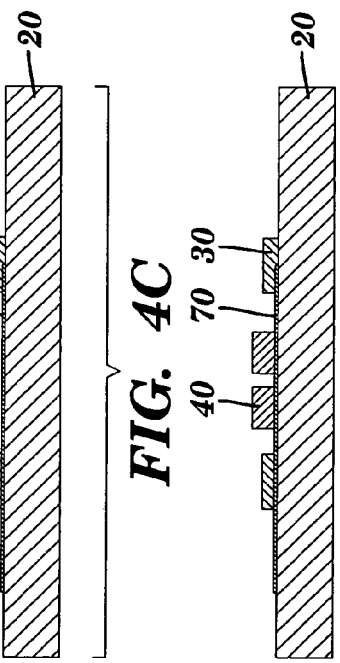 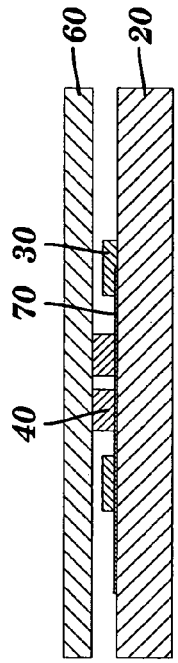 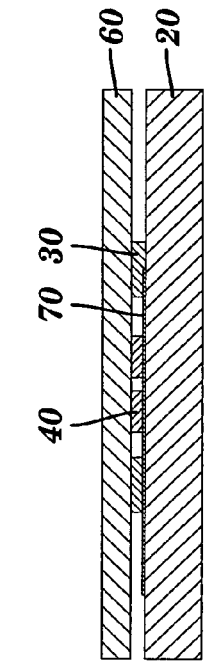 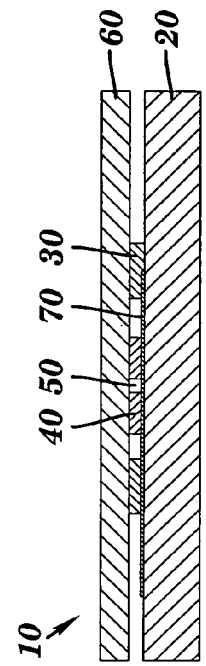
FIG. 4A   FIG. 4B   FIG. 4C   FIG. 4D   FIG. 4E   FIG. 4F   FIG. 4G

MICROFLUIDIC DEVICES FABRICATED BY DIRECT THICK FILM WRITING AND METHODS THEREOF

This application claims the benefit of U.S. Provisional Patent Application Ser. No. 60/642,654, filed Jan. 10, 2005, which is hereby incorporated by reference in its entirety.

FIELD OF THE INVENTION

The invention relates to microfluidic devices fabricated by direct thick film writing.

BACKGROUND OF THE INVENTION

Microfluidic devices are critical components for achieving miniaturization of a broad range of products including biochemical reactors, total chemical analysis systems, instrumentation, and systems-on-chip. Because the field has not yet matured, there is a need to quickly and inexpensively verify device designs. Thus, rapid prototyping techniques that can create complex, multi-functional microfluidic devices are sought by the art.

A wide variety of fabrication techniques have been described in the literature. M. J. Madou has provided a thorough overview in Fundamentals of Microfabrication: The Science of Miniaturization, $2^{nd}$ ed. (CRC Press, New York, 2002). N.-T. Nguyen and S. T. Wereley have summarized fabrication techniques of particular utility in the construction of microfluidic devices in Fundamentals and Applications of Microfluidics (Artech House, Boston, 2002). To appreciate the advantages of the present invention it is useful to categorize fabrication processes by the manner in which pattern formation of the elements of a microfluidic device is effected.

A first category of fabrication approaches consists of those that rely on photolithography employing a fixed photolithographic mask to define the structural features of a microfluidic device. Included among this group are the well-known batch fabrication techniques applied in the semiconductor and microelectromechanical systems (MEMS) industries. Some particularly well-documented batch fabrication techniques used to build microfluidic devices include thick film photopatternable materials such as the epoxy material known as SU-8 and the class of microcontact printing techniques known as soft lithography. As is widely recognized in the art, batch fabrication techniques generally involve a very lengthy and complicated set of processing steps, including spin casting, material deposition, material etching, thermal processing, and surface cleaning and preparation.

In this first category of fabrication approaches, the fixed photolithographic mask may be used to directly expose a photopatternable material which upon development the remaining portions of the material form structural elements of a microfluidic device. This is generally the approach used in SU-8 fabrication. Alternatively, the fixed photolithographic mask may be used to expose a relatively thin photoresist layer which upon development forms a stencil that can be used to effect pattern transfer through subsequent process steps. This is generally the approach used in the semiconductor and MEMS industries where the developed photoresist layer forms an impermeable stencil against an etch process capable of removing the substrate material not protected by the stencil. After removal of the remaining photoresist the substrate exhibits a surface height modulation that corresponds to the pattern of the fixed photolithographic mask. Soft lithography uses this approach to create a microstamp or molding master in a hard substrate such as silicon. The molding master can then be used to transfer pattern features to a polymer such as polydimethylsiloxane which can be poured onto the molding master, cured in place, removed from the molding master, and adhered to a second substrate to form microfluidic channels.

A second category of fabrication techniques has been developed wherein the overall fabrication schemes of the first category of techniques are preserved with the one exception that lithographic exposure is performed by a programmable exposure unit without the need for a fixed photolithography mask. The pattern information required to form the elements of a microfluidic device is stored electronically as a computer file and thus can be quickly modified. Examples of programmable exposure units well known in the literature include rastered laser exposure systems and programmable two-dimensional arrays of optical modulators such as micromirrors.

Direct writing technologies form a third category of fabrication approaches. As with the programmable exposure units described above, pattern information is manipulated and stored electronically so that no fixed photolithography masks are required. However, instead of the generally lengthy and complicated fabrication schedules of the first two categories, direct writing technologies form structural elements of a microfluidic device directly on or in the substrate using few processing steps. Direct writing technologies can be either subtractive or additive processes. Laser machining, wherein substrate material is selectively removed under the influence of an intense optical beam, is a subtractive direct writing technology. Additive direct writing technologies include ink-jet printing, pulsed laser ablation, microstereolithography, and micro-capillary deposition. The method described in the present invention uses an additive direct write technology employing micro-capillary deposition.

The fabrication approaches known within the current state-of-the-art all suffer from a large number of problems and limitations. The use of fixed photolithography masks imposes significant costs and time delays in the fabrication process. Substituting a programmable exposure unit for fixed photolithography masks involves costly capital equipment. Batch fabrication approaches generally involve a lengthy and complicated process schedule. These approaches also generally require large numbers of different types of expensive processing tools that carry high costs associated with floor space and environment, maintenance, and operations. Existing fabrication approaches all suffer a limited palette of materials, defined as the variety of materials a given processing tool can handle. For example, several of the techniques cited above are specific for polymers and have limited or no application to other materials such as composites, ceramics, or metals. Ink-jet printing is limited to low viscosity liquids and cannot readily form thick film structural elements. Because of this limited palette of materials, devices formed from these fabrication approaches may be constrained to operate over restricted temperature ranges and may have inferior performance characteristics. Many of the current fabrication approaches impose severe limitations on substrate size, geometry, surface topography, and existing substrate features.

The present invention is directed to overcoming the deficiencies in the prior art.

SUMMARY OF THE INVENTION

One aspect of the present invention relates to a process for producing a microfluidic device which involves providing a substrate with a surface and writing a first flowable material on the surface of the substrate. The first flowable material is then solidified to form spacer elements, each with a top surface distal from the surface of the substrate, and a second flowable material is written on the surface of the substrate. A cover having a surface is provided and applied to the substrate, with the surface of the cover contacting the top surfaces of the spacer elements. The second flowable material is solidified to form walls, where the walls, the surface of the substrate, and the surface of the cover form flow channels of a microfluidic device.

Another aspect of the present invention relates to a microfluidic device which includes a substrate with a non-planar surface and a cover. One or more spacer elements on the non-planar surface connect the substrate and the cover. One or more walls are also between the cover and non-planar surface of the substrate, where the walls, the non-planar surface of the substrate, and the cover form flow channels of a microfluidic device.

The microfluidic device fabrication method of the present invention is advantageous in that it is capable of producing microfluidic devices of arbitrary design in a variety of materials and on a variety of starting substrates. Additionally, the wide palette of materials permitted by the method of the present invention means that a broad range of device components can be formed with a single fabrication tool and technology, thus reducing the need for capital equipment and its many associated costs. Another advantage of the method of the present invention is that it is highly insensitive to substrate size, geometry, surface topography, and existing substrate features.

Microfluidic devices fabricated according to the present invention are advantageous because they can be constructed more quickly and at lower cost. The wide palette of materials available to microfluidic devices fabricated according to the present invention extends the operating temperatures and improves the performance characteristics. Additionally, according to the present invention microfluidic devices can achieve higher degrees of integration and functionality through construction on substrates having a broad range of existing features and arbitrary size, geometry, and surface topography.

These and other aspects, objects, features and advantages of the present invention will be more clearly understood and appreciated from a review of the following detailed description of the preferred embodiments and appended claims, and by reference to the accompanying drawings.

BRIEF DESCRIPTION OF THE DRAWINGS

FIGS. 2A through 2F illustrate in cross-sectional views the fabrication steps of a microfluidic device taken across lines A-A and B-B of FIG. 1;

FIGS. 4A through FIGS. 4G illustrate in cross-sectional views the fabrication steps of a microfluidic device with an integrated electrical contact according to FIG. 3.

To facilitate understanding, identical reference numerals have been used, where possible, to designate identical elements that are common to the figures.

DETAILED DESCRIPTION OF THE INVENTION

One aspect of the present invention relates to a process for producing a microfluidic device which involves providing a substrate with a surface and writing a first flowable material on the surface of the substrate. The first flowable material is then solidified to form spacer elements, each with a top surface distal from the surface of the substrate, and a second flowable material is written on the surface of the substrate. A cover having a surface is provided and applied to the substrate, with the surface of the cover contacting the top surfaces of the spacer elements. The second flowable material is solidified to form walls, where the walls, the surface of the substrate, and the surface of the cover form flow channels of a microfluidic device.

Another aspect of the present invention relates to a microfluidic device which includes a substrate with a non-planar surface and a cover. One or more spacer elements on the non-planar surface connect the substrate and the cover. One or more walls are also between the cover and non-planar surface of the substrate, where the walls, the non-planar surface of the substrate, and the cover form flow channels of a microfluidic device.

Figure 1:
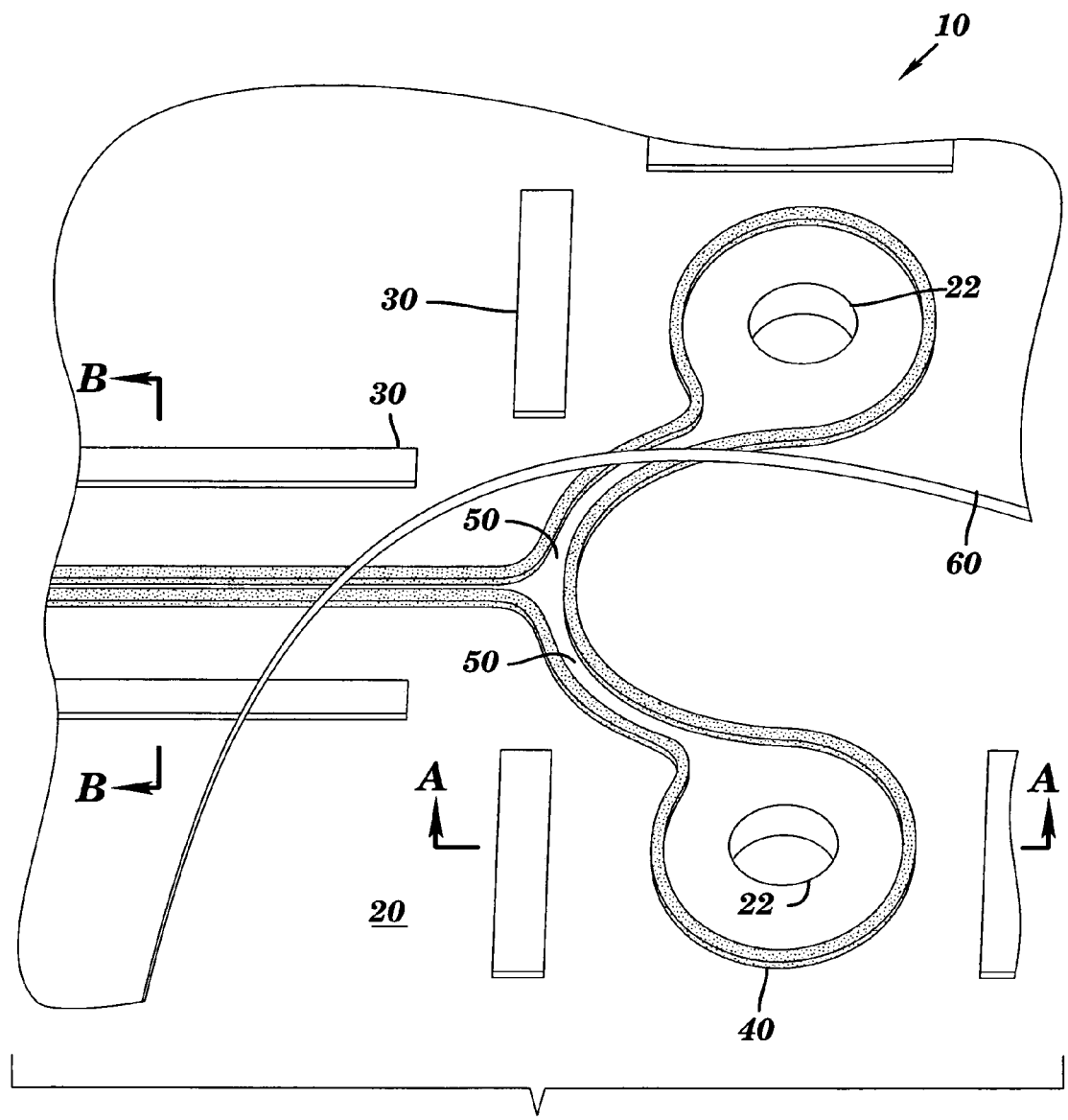
FIG. 1 is a partial perspective view of a microfluidic device fabricated according to the present invention.

In FIG. 1, microfluidic device 10 according to the present invention is shown. The microfluidic device is formed on substrate 20 having a multiplicity of substrate through-holes 22. Spacer layer 30 is first formed on the substrate by direct thick film writing. The spacer layer may be formed as a series of segments, as shown, or as a single continuous pattern. It is important that the spacer layer exhibit a uniform thickness. Microchannel layer 40 is next formed on the substrate by direct thick film writing. The microchannel layer is typically deposited with a thickness that is greater than the thickness of the spacer layer. Microfluidic pathway 50 is formed by the geometrical pattern of the microchannel layer. Cover 60 (shown partially cut away) is then pressed down on the assembly until it comes to rest on the spacer layer.

FIGS. 2A through FIGS. 2F illustrate a detailed process flow along lines A-A and B-B of FIG. 1 for construction of microfluidic devices pursuant to the present invention.

According to FIG. 2A, the fabrication process starts with substrate 20 having a multiplicity of substrate through-holes 22. Depending on the application, the substrate may be a polymer, a metal, a glass, a ceramic, a semiconductor, or a composite thereof. The through-hole may be provided by drilling, punching, milling, etching, pressing, or molding. In a preferred embodiment, the substrate is a ceramic formed by pressing in a mold to form a multiplicity of through-holes in selected locations. In some embodiments of the present invention, the substrate was a non-planar surface.

In FIG. 2B, spacer layer 30 is disposed on the substrate by direct thick film writing. Writing methods include screen printing, jetting, laser ablation, and pressure-driven syringe delivery. In a preferred embodiment, the spacer layer 30 is formed by the technique described in U.S. Pat. No. 4,485,387 to Drumheller, which is hereby incorporated by reference in its entirety. According to Drumheller, such patterns are written by feeding ink through an orifice of a writing pen where a pen control system operates substrate movement and ink pumping. The spacer layer material may be a polymer, metal, glass, ceramic, semiconductor, or a composite of two or more of these materials. Depending on the application, spacer layer 30 may require subsequent processing to render it sufficiently rigid. Such subsequent processing includes drying in air or other gaseous ambient, baking at elevated temperature in an oven, firing at high temperature in a furnace, or curing with radiant energy such as ultraviolet light. In a preferred embodiment, spacer layer 30 is a printable dielectric ink fired in a furnace at 100 to 850° C. An important aspect of the present invention is that the thickness of spacer layer 30 be uniform and equal to, after any subsequent processing, the intended height of microfluidic pathways 50 which ranges from 0.005 to 2 mm. To achieve such heights for microfluidic pathways 50, the thickness of spacer layer 30 should be 0.005 to 4 mm. In another preferred embodiment, spacer layer 30 is a photopolymer cured by exposure to ultraviolet radiation.

Microchannel layer 40 is disposed on the substrate by direct thick film writing, as shown in FIG. 2C. Writing methods include screen printing, jetting, laser ablation, and pressure-driven syringe delivery. In a preferred embodiment, microchannel layer 40 is formed by the technique described by Drumheller supra. The microchannel layer material may be a polymer, metal, glass, ceramic, semiconductor, or a composite of two or more of these materials. The selected material can be the same as or different from that used for the spacer layer. The thickness of microchannel layer 40 is preferably equal to or greater than the thickness of the spacer layer, with the thickness of microchannel layer 40 before solidification being 0.005 to 2.5 mm. In a preferred embodiment, the microchannel layer 40 is a printable dielectric ink curable at a lower temperature than the material used to form the spacer layer 30. In another preferred embodiment, the microchannel layer 40 is a printable photopolymer curable by exposure to ultraviolet radiation.

Referring to FIG. 2D, cover 60 is positioned such that it comes into contact with microchannel layer 40. The cover material may be made of a polymer, metal, glass, ceramic, semiconductor, or a composite of two or more of these materials. The cover material must be capable of bonding to microchannel layer 40. In a preferred embodiment the cover is glass.

Cover 60 is pressed down until it contacts the spacer layer, as depicted in FIG. 2E. It is preferable to use a mechanical fixture to prevent any lateral motion of the cover during this step.

In FIG. 2F, microfluidic device 10 is processed to produce a rigid microchannel layer 40. This creates microfluidic pathways 50. In a preferred embodiment, the microfluidic device is baked at 90° C. to cure microchannel layer 40 consisting of printable dielectric ink. In another preferred embodiment the microfluidic device is exposed to ultraviolet radiation to cure microchannel layer 40.

Figure 3:
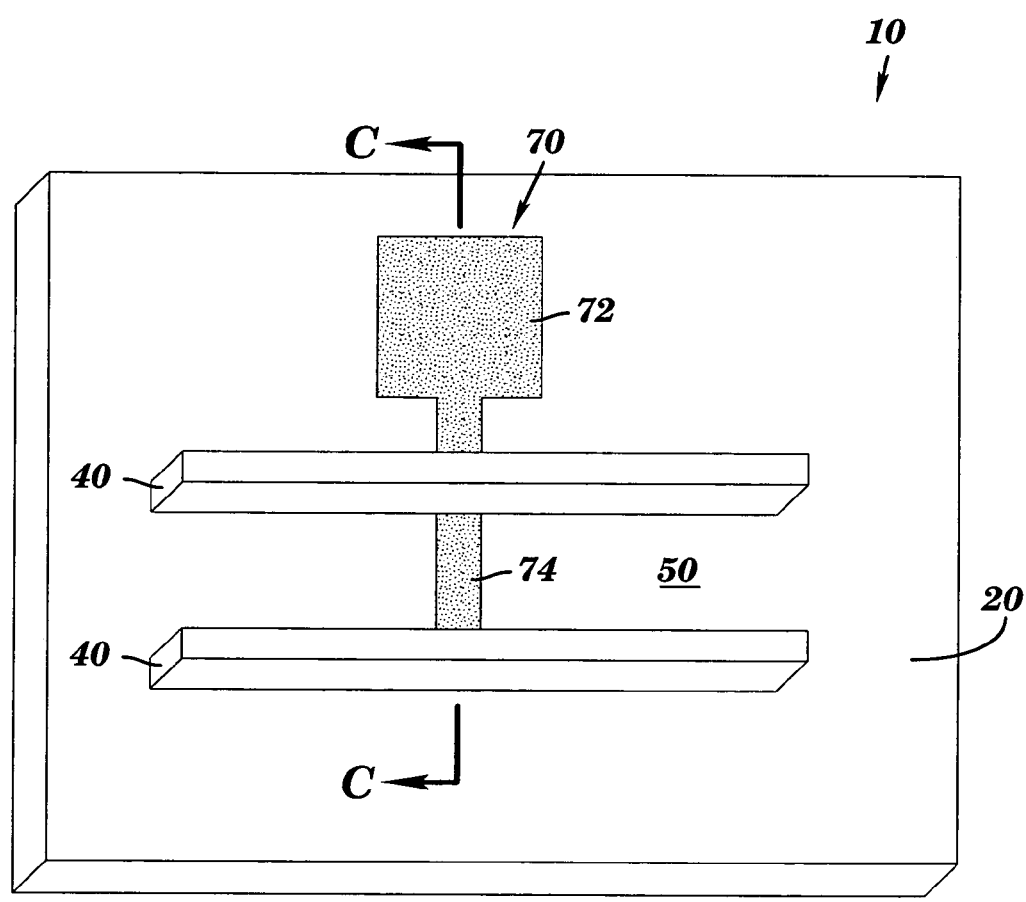
FIG. 3 is a partial perspective view of a microfluidic device with an integrated electrical contact, in accordance with the present invention.

Operation of microfluidic device 10 can be enhanced by integrating electrical contact 70, as shown in FIG. 3. The electrical contact is deposited on substrate 20 and consists of contact pad 72, which provides electrical access either to other parts of the substrate or to the exterior of microfluidic device 10, and conductive trace 74, which passes beneath the microchannel layer and into microfluidic pathway 50. Preferably, these conductive materials are written on substrate 20 with conductive ink prior to writing spacer layer 30.

FIGS. 4A through FIGS. 4G illustrate a detailed process flow along section C-C of FIG. 3 for construction of microfluidic devices integrated with electrical contacts.

Referring to FIG. 4A, the fabrication process starts with substrate 20. Depending on its application, the substrate may be a polymer, a metal, a glass, a ceramic, or a semiconductor. In a preferred embodiment, the substrate is a ceramic formed by pressing in a mold whereby a multiplicity of through-holes are formed in prescribed locations.

Electrical contact 70 is disposed on the substrate by direct thick film writing, as shown in FIG. 4B. Writing methods include screen printing, jetting, laser ablation, and pressure-driven syringe delivery. In a preferred embodiment, the electrical contact is formed by the technique described by Drumheller. The electrical contact is applied as a printable metal ink and then fired and cured. The electrical contact is preferably formed from printable metal inks containing carbon, nickel, tungsten, titanium, copper, silver, platinum, palladium, or gold. In a preferred embodiment, the electrical contact is formed from a silver-bearing printable metal ink.

In FIG. 4C, spacer layer 30 is disposed on the substrate by direct thick film writing. Writing methods include screen printing, jetting, laser ablation, and pressure-driven syringe delivery. In a preferred embodiment, the spacer layer is formed by the technique described by Drumheller. The spacer layer material may be a polymer, metal, glass, ceramic, semiconductor, or a composite of two or more of these materials. Depending on the application, the spacer layer may require subsequent processing to render it sufficiently rigid. Such subsequent processing includes drying in air or other gaseous ambient, baking at elevated temperature in an oven, firing at high temperature in a furnace, or curing with radiant energy such as ultraviolet light. In a preferred embodiment, the spacer layer 30 is a printable dielectric ink that can be cured in an oven at 90° C. An important aspect of the present invention is that the thickness of spacer layer 30 be uniform and equal to, after any subsequent processing, the intended height of microfluidic pathways 50. In another preferred embodiment, the spacer layer 30 is a printable photopolymer curable with ultraviolet radiation.

FIG. 4D shows disposing microchannel layer 40 on the substrate by direct thick film writing. Writing methods include screen printing, jetting, laser ablation, and pressure-driven syringe delivery. In a preferred embodiment, microchannel layer 40 is formed by the technique described by Drumheller. The microchannel layer material may be a polymer, metal, glass, ceramic, semiconductor, or a composite of two or more of these materials. The thickness of microchannel layer 40 is preferably equal to or greater than the thickness of spacer layer 30. In a preferred embodiment, microchannel layer 40 is a printable dielectric ink curable at temperatures compatible with spacer layer 30 and electrical contact 70. In another preferred embodiment, microchannel layer 40 is a printable photopolymer curable with ultraviolet radiation.

Cover 60 is positioned such that it comes into contact with microchannel layer 40, as shown in FIG. 4E. The cover material may be made of a polymer, metal, glass, ceramic, semiconductor, or a composite of two or more of these materials. The cover material must be capable of bonding to microchannel layer 40. In a preferred embodiment, the cover is glass.

Referring to FIG. 4F, cover 60 is pressed down until it contacts spacer layer 30, thus, causing the wall formed from microchannel layer 40 to have the same height as spacer layer 30. It is preferable to use a mechanical fixture to prevent any lateral motion of the cover during this step.

As shown in FIG. 4G, microfluidic device 10 is processed to solidify microchannel layer 40. This creates microfluidic pathway 50. In a preferred embodiment, the microfluidic device is baked at 90° C. to cure microchannel layer 40 consisting of printable dielectric ink. In another preferred embodiment, the microchannel device is exposed to ultraviolet radiation to cure microchannel layer 40 consisting of a printable photopolymer.

Figure 5:
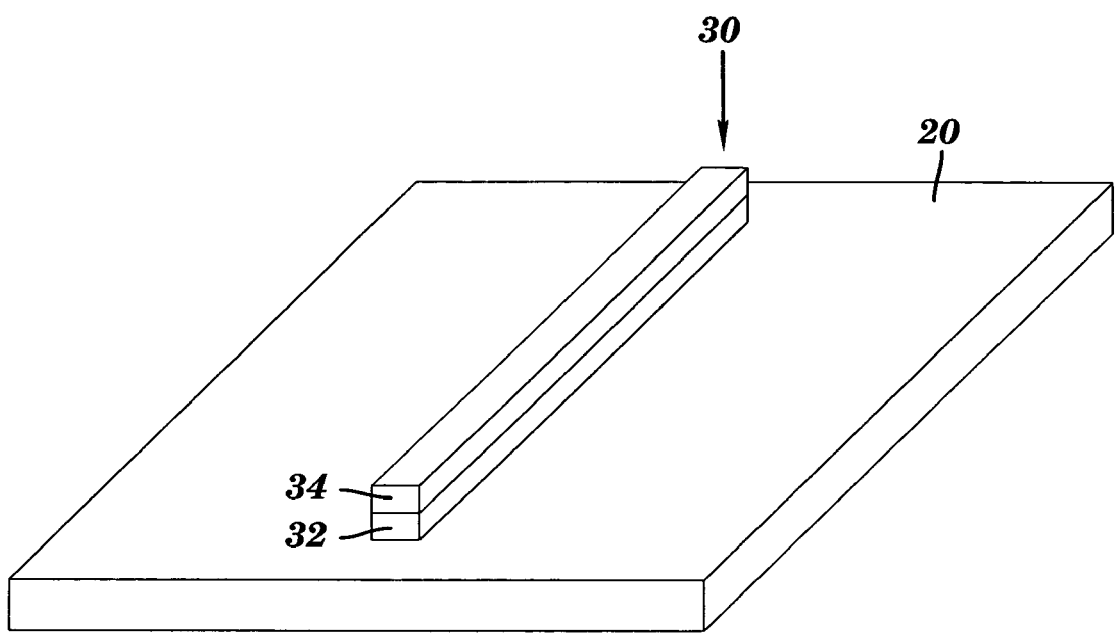
FIG. 5 is a partial perspective view of a spacer layer on a substrate created by two direct writing steps, in accordance with the present invention.

Spacer layer 30 may be built up by sequential deposition of first written spacer layer 32 and second written spacer layer 34, as shown in FIG. 5. It will be appreciated by those skilled in the art that even more than two distinct writing steps can be employed to achieve greater thickness of the spacer layer. Depending on the deposition technique and materials used, the various written layers may require drying, curing, partial curing, firing, or partial firing in between writing steps to obtain acceptable performance. It should also be appreciated that the technique of using multiple writing steps can also be applied to microchannel layer 40 and electrical contact 70.

Making fluidic interconnections from the external world to the microfluidic device is an important consideration. The present invention simplifies the task of making fluidic interconnects by allowing through-holes on both the cover and the substrate.

Figure 6A:
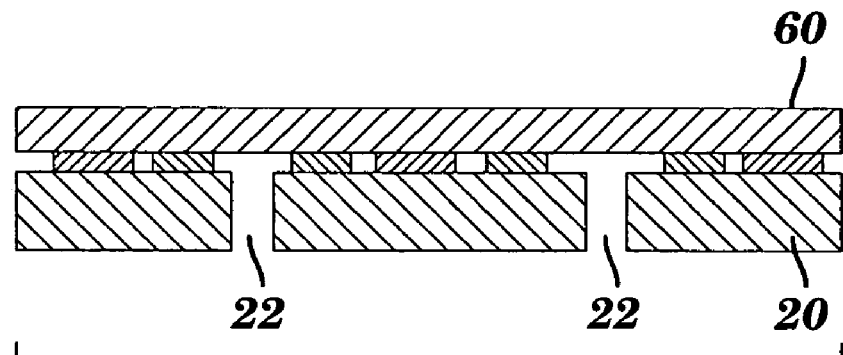
FIGS. 6A through FIGS. 6C illustrate in cross-sectional views alternatives for external fluidic interconnections, in accordance with the present invention.
Figure 6B:
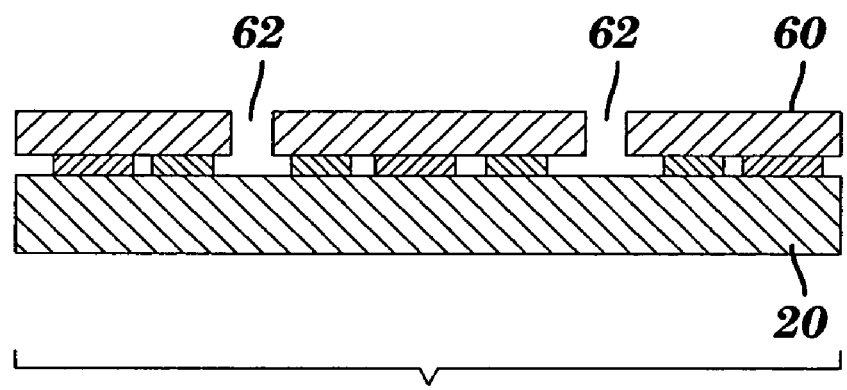
Figure 6C:
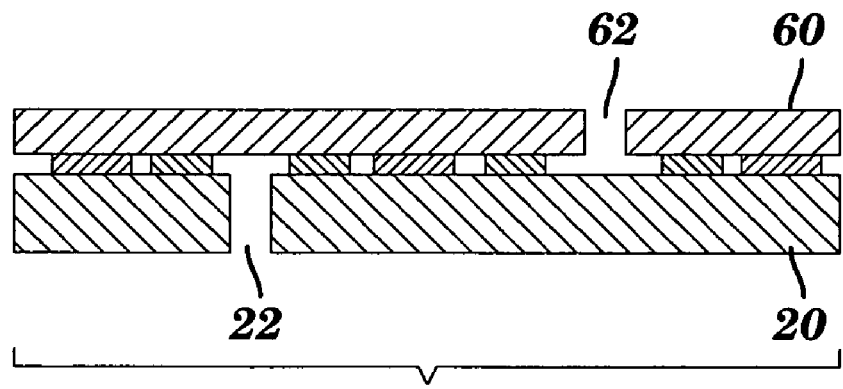

FIGS. 6A through FIGS. 6C illustrate cross-sectional views of various interconnect schemes, in accordance with the present invention. All of the fluidic interconnections may pass through substrate through-holes 22 (FIG. 6A), or cover through-holes 62 (FIG. 6B), or some fluidic interconnections may pass through substrate through-holes 22 while others pass through cover through-holes 62 (FIG. 6C). The exact distribution is determined by the particular application.

Figure 7:
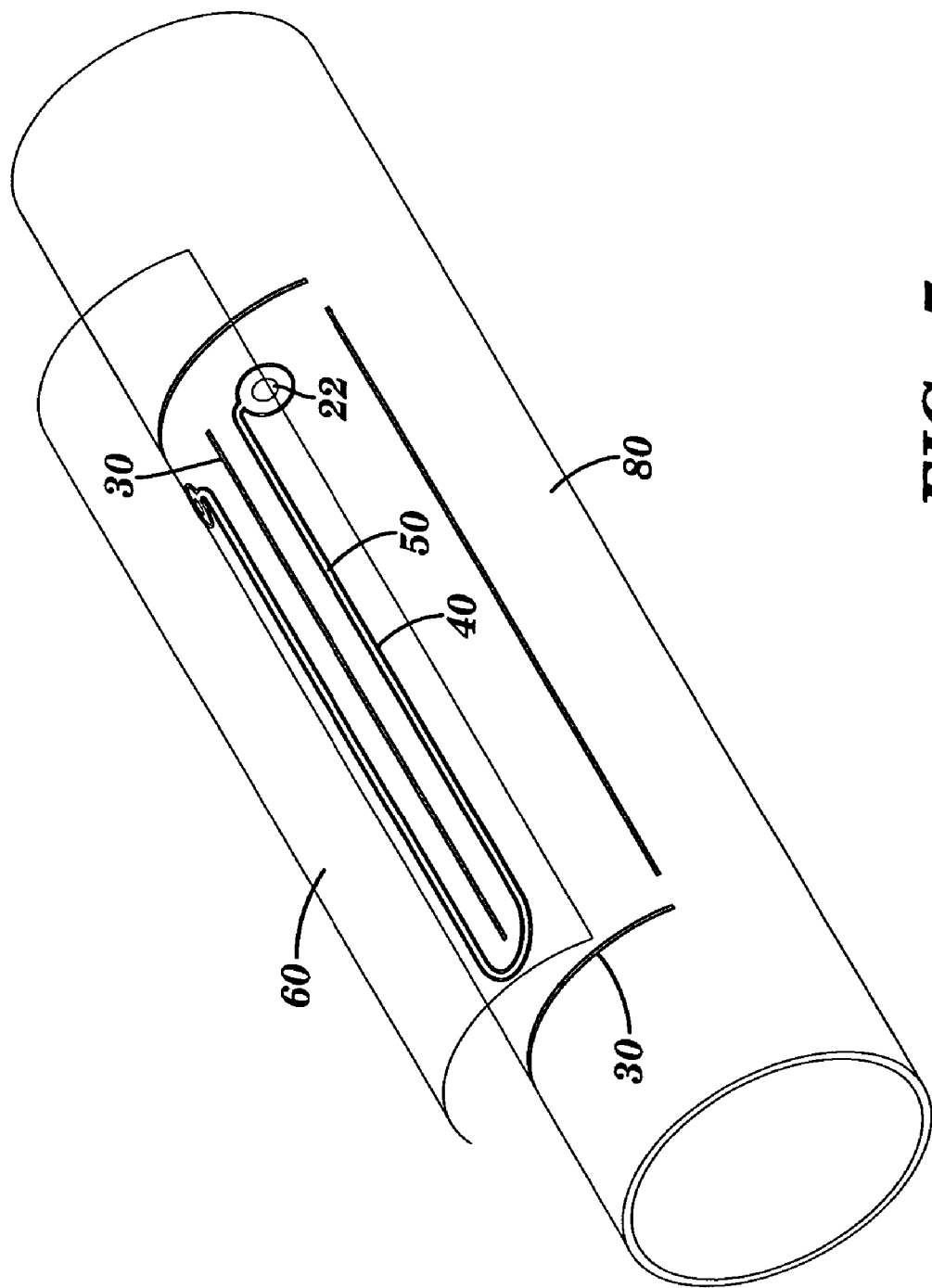
FIG. 7 is a partial perspective view of a microchannel layer on a cylindrically-shaped substrate, in accordance with the present invention.

FIG. 7 illustrates the suitability of the method of the present invention to form microchannel devices on non-planar substrates. Spacer layer 30 and microchannel layer 40 are disposed on the outer surface of a cylindrically-shaped substrate 80 with the walls of microchannel layer 40 defining microfluidic pathways 50. Cover 60 is then pressed down on the assembly until it comes to rest on the spacer layer. In this example the interior volume of cylindrically-shaped substrate 80 communicates with the microchannel layer 40 by a multiplicity of substrate through-holes 22.

It will be appreciated by those skilled in the art that the spacer layer or the microchannel layer or the electrical contact or any combination of these elements could be written partially or in whole upon the cover.

It will also be appreciated that the present invention covers the case where the substrate or the cover or both are non-planar.

Additionally, it will be appreciated that the present invention covers the case where the substrate, before treatment in accordance with the present invention, already includes existing features and devices. These features and devices are formed for purposes, including but not limited to, computation, communication, sensing, actuation, optical modulation, signal or species analysis, material transport, and fluid flow.

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed:

1. A process for producing a microfluidic device, said process comprising:

providing a substrate with a non-planar surface;

writing a first flowable material on the non-planar surface of the substrate;

solidifying the first flowable material to form spacer elements, each with a top surface distal from the non-planar surface of the substrate;

writing a second flowable material on the non-planar surface of the substrate, wherein said writing the first flowable material and the second flowable material is carried out by micro-capillary deposition;

providing a cover having a surface;

applying the cover to the substrate, whereby the surface of the cover contacts the top surfaces of the spacer elements; and solidifying the second flowable material to form walls, whereby the walls, the non-planar surface of the substrate, and the surface of the cover form flow channels of a microfluidic device.

2. The process of claim 1, wherein the first and second flowable materials are the same.

3. The process of claim 1, wherein the first and second flowable materials are different.

4. The process of claim 1, wherein a conductive material is on the non-planar surface of the substrate.

5. The process of claim 4, wherein the conductive material is in at least some of the flow channels of the microfluidic device.

6. The process of claim 4, wherein the conductive material is applied to the substrate prior to said writing a first flowable material.

7. The process of claim 4, wherein the conductive material is written on the non-planar surface of the substrate as a conductive ink.

8. The process of claim 1, wherein said applying the cover to the substrate compresses the second flowable material to substantially the same thickness as the spacer elements.

9. The process of claim 1, wherein there are one or more holes extending through the substrate and/or the cover from their surfaces to supply and/or remove fluids to and/or from the flow channels.

10. The process of claim 1, wherein the substrate and the cover are independently made from a material selected from the group consisting of a polymer, a metal, a ceramic, a semiconductor, and a composite thereof.

11. The process of claim 1, wherein said solidifying is carried out by heating or curing with radiant energy.

12. The process of claim 1, wherein the first and/or second flowable material is selected from the group consisting of a polymer, a metal, a glass, a ceramic, a semiconductor, and a composite thereof.

13. The process of claim 1 further comprising:

writing a further layer of the first flowable material on the top surface of the solidified spacer element and solidifying the first flowable material of said further layer to form the top surface of the spacer elements.

* * * * *